(12) United States Patent
Ogawa

(10) Patent No.: US 6,671,502 B1
(45) Date of Patent: Dec. 30, 2003

(54) CONTROL DEVICE FOR RADIO REPEATER IN COMMUNICATION FIELD

(75) Inventor: Noboru Ogawa, Machida (JP)

(73) Assignee: Harada Industry Co., Ltd., Tokyo (JP)

( * ) Notice: Subject to any disclaimer, the term of this patent is extended or adjusted under 35 U.S.C. 154(b) by 0 days.

(21) Appl. No.: 09/537,210

(22) Filed: Mar. 29, 2000

(30) Foreign Application Priority Data

Mar. 31, 1999 (JP) .......................................... 11-093961

(51) Int. Cl.⁷ .............................................. H01Q 11/12
(52) U.S. Cl. .................. 455/127.1; 455/69; 455/127.3; 455/249.1
(58) Field of Search .................. 455/522, 69, 126, 455/127, 249.1, 251.1, 253.2, 7, 11.1, 16, 127.1, 127.2, 127.3; 330/129, 140, 282, 284; 333/81 R; 327/308, 316, 323; 370/492

(56) References Cited

U.S. PATENT DOCUMENTS

| | | | |
|---|---|---|---|
| 4,000,467 A | 12/1976 | Lentz | |
| 4,061,970 A | * 12/1977 | Magneron | 455/14 |
| 4,124,825 A | 11/1978 | Webb et al. | |
| 5,408,197 A | * 4/1995 | Miyake | 330/129 |
| 5,485,486 A | 1/1996 | Gilhousen et al. | |
| 5,608,755 A | 3/1997 | Rakib | |
| 5,678,198 A | * 10/1997 | Lemson | 455/67.1 |
| 5,732,334 A | * 3/1998 | Miyake | 455/126 |
| 5,815,795 A | 9/1998 | Iwai | |

OTHER PUBLICATIONS

Third Office Action, State Intellectual Property Office of People's Republic of China, for app No. 00105581.X, issued Jun. 20, 2003, original and English translation.

* cited by examiner

Primary Examiner—Edward F. Urban
Assistant Examiner—Sonny Trinh
(74) Attorney, Agent, or Firm—Pennie & Edmonds LLP

(57) ABSTRACT

A control device has an input section which inputs a predetermined signal, an amplification section of a variable gain type which amplifies the predetermined signal, and a feedback loop which inputs a signal output from the amplification section and adjusts a gain of the amplification section to keep the output signal constant.

3 Claims, 3 Drawing Sheets

CONTROL DEVICE FOR RADIO REPEATER IN COMMUNICATION FIELD

CROSS-REFERENCE TO RELATED APPLICATIONS

This application is based upon and claims the benefit of priority from the prior Japanese Patent Application No. 11-093961, filed Mar. 31, 1999, the entire contents of which are incorporated herein by reference.

BACKGROUND OF THE INVENTION

The present invention relates to a control device to average gain, especially, to a control device which averages gain of the radio repeater device in communication field.

Usually, the carrier amplifiers of up-link and down-link incorporated into the radio repeater device can obtain the amplification gain set for the input level. However, when the extremely high level signal is input, this amplifier has the disadvantage of saturating for the high sensitivity amplifier.

Thus, there is a disadvantage of generating the high frequency distortion when the amplifier is saturated because of the input of a high-level signal in the radio repeater device.

As described above, in the radio repeater device, the amplifier is saturated because of the input of a high-level signal, as a result, the high frequency distortion is occurred.

Since the radio repeater device treats a plurality of carriers, it is necessary to build in the I/O level limitation device not to occur the above-mentioned high frequency distortion.

BRIEF SUMMARY OF THE INVENTION

An object of the present invention is to provide an effective control device to average gain, especially, to a control device which averages gain of amplifier device which operates at high frequency like radio repeater device in communication field.

The present invention adopts the following means to solve the above-mentioned problem.

A control device according to the present invention characterized by comprising: an input section which inputs a predetermined signal; an amplification section of a variable gain type which amplifies the predetermined signal; and a feedback loop which inputs a signal output from the amplification section and adjusts a gain of the amplification section to keep the output signal constant. The level of the input signal can be averaged, for example, in the radio repeater device since this feedback loop is provided. In the above-mentioned configuration, the band-pass filter may be omitted, when it is unnecessary to limit the frequency, and the number of stages of amplifier sections may be also arbitrary.

In the above-mentioned control device, the amplification section comprises an amplifier of a fixed-gain type and an attenuator in which an attenuation amount is changed according to a signal from the feedback loop. Since the amplifier and the attenuator is provided and the adjustment of the gain is performed with the attenuator, the operation of the amplifier becomes stable in addition to the above-mentioned advantage.

In the above-mentioned control device, the attenuator has an attenuation element including a PIN diode, a first resistance element having a first end and a second end, the first end connected with a previous stage of the attenuation element and the second end connected with a first voltage, and a second resistance element having a third end and a fourth end, the third end connected with a previous stage of the attenuation element and the fourth end connected with a second voltage. Since high-speed operation becomes possible by using the element which can perform high-speed switching like the PIN diode as an attenuation element of the attenuator, a suitable control device for the radio repeater device especially used in the high frequency region can be provided in addition to the above-mentioned advantage.

In the above-mentioned control device, the amplification section comprises at least a first amplifier and a second amplifier of a variable gain type, the device further comprises a band-pass filter arranged between the first amplifier and the second amplifier to pass only a signal of a predetermined band, and the first amplifier amplifies the input signal to output an amplified signal to the band-pass filter, and the second amplifier amplifies a signal which has passed the band-pass filter. Averaging the level of the input signal in the radio repeater device becomes possible with such a configuration.

The control device according to the present invention characterized by comprising: an antenna which receives a carrier; a first amplification section of a variable gain type which amplifies the carrier; a band-pass filter to pass only a carrier in a predetermined band; a second amplification section of a variable gain type which amplifies a carrier which has passed the band-pass filter; and a feedback loop which inputs a carrier output from the second amplification section and adjusts a gain of the first and the second amplification sections to keep the output carrier constant. Averaging the level of the input signal in the radio repeater device becomes possible with such a configuration.

The control device according to the present invention is characterized by comprising: an antenna which receives a division multiplexed carrier; a first band-pass filter to pass a desired band of the carrier; a plurality of amplifiers provided in each channel which amplifies a carrier, which has passed the first band-pass filter, to a desired intensity for each channel; a scanning section which phase-synchronizes the carrier which has passed the first band-pass filter, performs analog-to-digital conversion of a detected signal and output a converted signal; and a controller which sets an optimal output of the plurality of amplifiers based on the signal from the scanning section and adjusts gains of the plurality of amplifiers. Averaging the level of each channel in the division multiple access method is possible.

As described above, an effective input signal level can be averaged with a simple circuit. Especially, it is possible to average the input signal in the high frequency region. It is possible to apply to the control circuit (device) which keeps a variety of physical amount to be constant with a simple circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
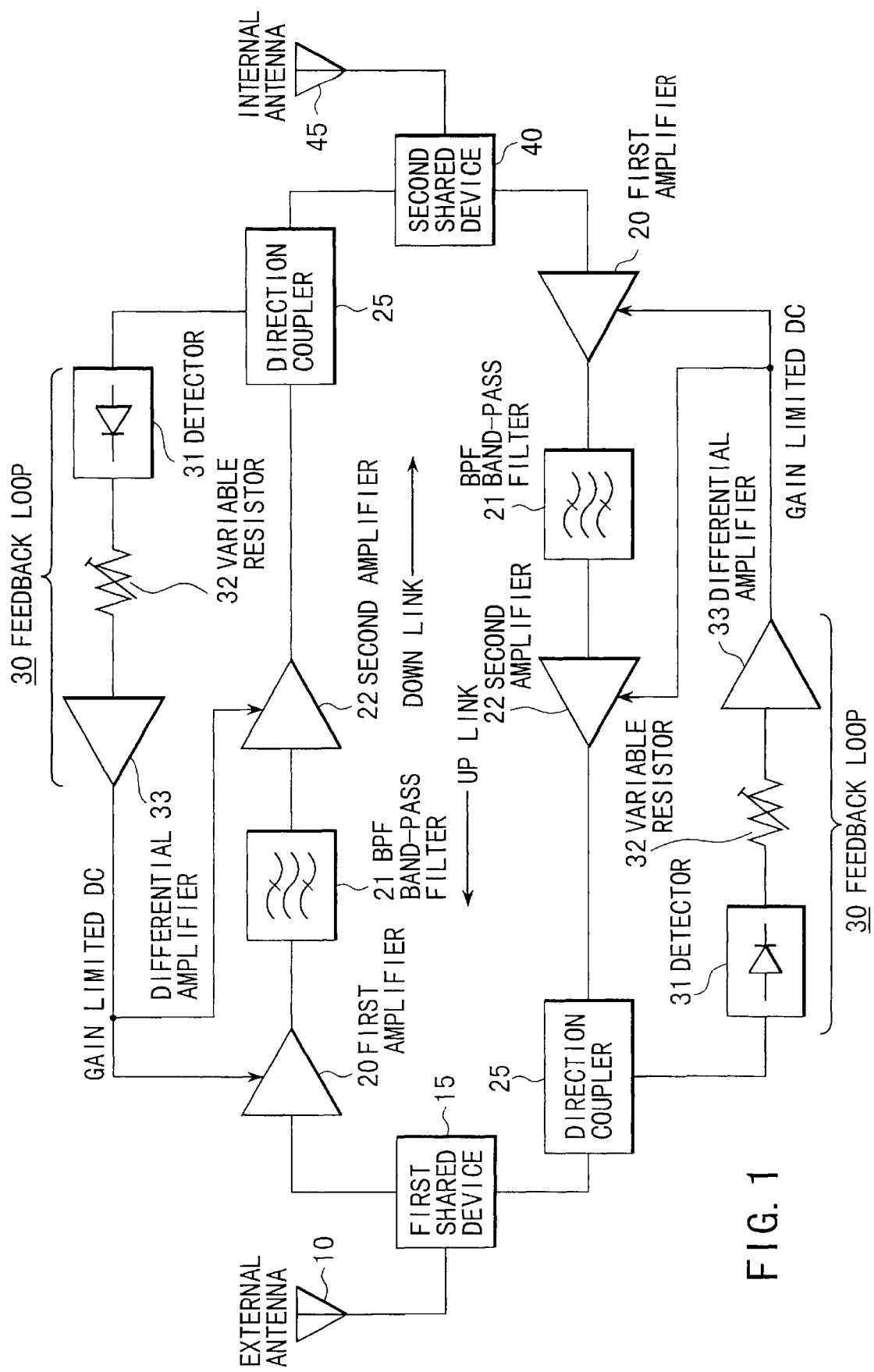
FIG. 1 is an outline figure of the control device according to the first embodiment of the present invention.

The embodiment of the present invention will be explained referring to the drawings.

FIG. 1 is an outline figure of the control device according to the first embodiment of the present invention.

Usually, the carrier level of a nearer place of the portable terminal and a farther place of the portable terminal from the antenna of the blind zone of the premises is automatically limited by the power control function by RSSI (Radio-Signal Strength Indicator) of the portable terminal. In the first embodiment, the carrier levels of the base station and the portable terminal are averaged by using this function. That is, the embodiment is characterized by comprising the automatic amplification averaging circuit (including burst signal averaging circuit) for both of each of amplification circuits of up-link and down-link.

Specific operation will be explained referring to FIG. 1. In the following explanations, since down-link and up-link have the same configuration and the same operation, averaging of the carrier level only in down-link will be explained, and the explanation concerning up-link will be omitted.

The carrier received with external antenna 10 is input to first shared device 15, and is input to first amplifier 20 of a variable gain and is amplified. The carrier amplified with first amplifier 20 is band-limited with band-pass filter 21, amplified with the second variable gain amplifier 22, combined with feedback loop 30 by directional coupler 25 described later, and output from internal antenna 45 through second shared device 40. In the present invention, the output from the second amplifier 22 is input to feedback loop 30 as a feedback signal by directional coupler 25. The feedback signal is detected by detector 31, first, and the output is adjusted in the level, for example, with variable resistor 32. Thereafter, the signal is compared with differential amplifier 33 with a standard value (threshold level), and when exceeding the threshold level, the gain limitation current is output to first and second amplifiers 20 and 22, and the gain of first and second amplifiers 20 and 22 is decreased.

With above-mentioned construction, saturation of the radio repeater device can be prevented.

Though, in the above-mentioned embodiment, it is described that device has first to third amplifiers each of which includes only one amplifier, a plurality of amplifiers may be connected in the multi-steps to obtain a necessary amplification, respectively.

Figure 2:
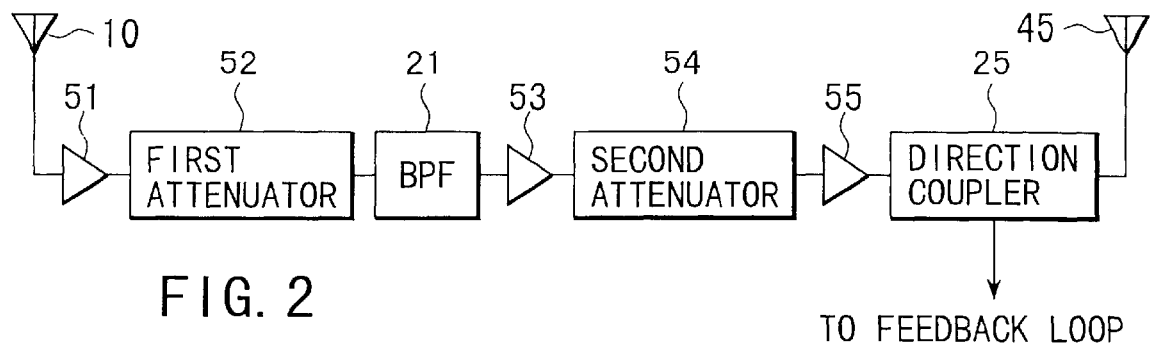
FIG. 2 is an outline figure of the control device according to the second embodiment of the present invention.

FIG. 2 is an outline figure of the control device according to the second embodiment of the present invention.

In the second embodiment, since the configuration of feedback loop 30 is similar to the first embodiment, drawings and explanation will be omitted. only down-link is shown and up-link is omitted in FIG. 2. Therefore, a shared device etc. are omitted in the figure. In addition, since the configuration of the feedback loop is also similar to FIG. 1, drawings and explanation will be omitted.

Though saturation of the radio repeater device is prevented by inputting the input from feedback loop 30 to first and second variable gain amplifiers 20 and 22, and changing the gain of first and second amplifiers 20 and 22, in the first embodiment, in this embodiment, the gain is adjusted by inserting the attenuator between amplifiers, and inputting the output from feedback loop 30 to the attenuator.

In FIG. 2, the carrier from external antenna 10 is input to first amplifier 51 and amplified by the predetermined gain. Then, the carrier is input to first attenuator 52 described later in detail. Thereafter, the carrier with the predetermined band passes by band-pass filter 21. The carrier, which is input to the second amplifier 53 and amplified in a predetermined amount, is input to second attenuator 54 described later in detail. The carrier is amplified in a predetermined amount with third amplifier 55 and output from internal antenna 45. In FIG. 2, since it is clear for the skilled in the art to use the capacitor to cut the DC component, drawings are omitted.

Figure 3:
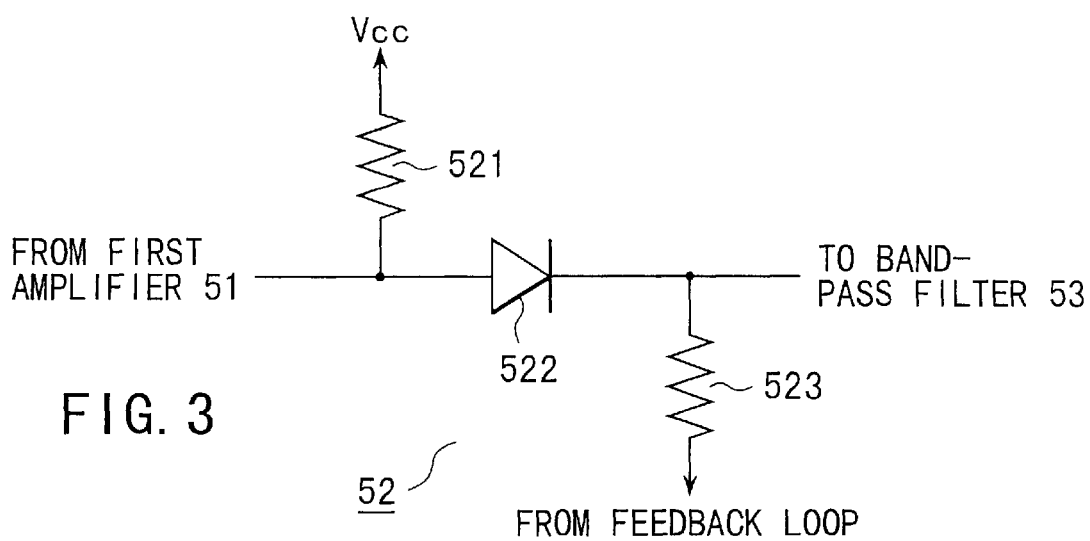
FIG. 3 is a figure which shows the configuration example of first and second attenuators 52 and 54.

The example of the configuration of first and second attenuators 52 and 54 is shown in FIG. 3. Since first and second attenuators 54 is the same configuration, the configuration of first attenuator 52 is shown and the operation will be explained.

First attenuator 52 has attenuation element 522 which consists of, for example, the PIN diode, the first resistance element 521 connected with power-supply voltage (Vcc) is arranged in the previous stage thereof, and the second resistance element 523 connected with the output of feedback loop 30 is arranged in the latter part of attenuation element 522. This PIN diode functions as attenuation element 522 which can operate at a high frequency (for example, 100 GHz) in this embodiment. Here, specific operation of first attenuator as constructed above will be explained.

The attenuation of the signal level is eliminated since voltage Vcc is applied to attenuation element 522 in a positive direction if the output of feedback loop 30 is 0V, and first attenuator 52 does not accomplish the function as the attenuator. Next, since the potential difference is not occurred in attenuation element 522 if the output of feedback loop 30 is Vcc, the signal attenuates for threshold level of attenuation element 522 (for example, 20 dB). Therefore, since the attenuation amount can change by output of feedback loop 30 (that is, since the threshold level of attenuation element 522 is changed), the desired attenuation amount can be obtained. In other words, in the second embodiment, the amplifier and the attenuator construct variable gain amplifier in the first embodiment. With this configuration, it becomes possible to adjust the gain of the amplifier which operates at a high frequency more easily than the first embodiment.

Resistance element 523 may be connected with –Vcc. In this case, output from feedback loop 30 becomes a value between Vcc to 0V. As for voltage connected with first resistance element 521 and second resistance element 523, it may be any configurations if the output from feedback loop 30 is input to either of them and it is a connection relationship in which attenuation element 522 performs operation as described above. In addition, the resistance element may be MOSFET with the predetermined threshold level and may be an element which functions additionally as resistance.

Though, in the control device of FIG. 2, the embodiment used as a device of averaging the gain of the radio repeater device which operates especially at a high frequency is explained, it is not limited to this. It is possible to use for various devices which average the gain by feedback loop 30. For example, the example of the control device, which keeps the temperature constant by using temperature detector 60 (for example, thermo-couple) instead of the antenna, is shown in FIG. 4.

Figure 4:
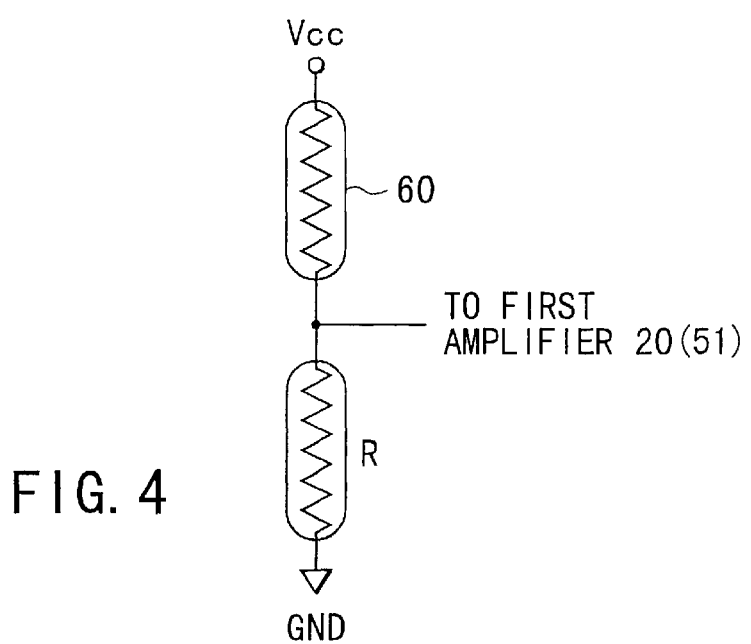
FIG. 4 is a figure which shows an example of the control device which keeps temperature constant.

In FIG. 4, since operation same as the control device of FIG. 1 and FIG. 2 is performed excluding temperature detector 60, drawings and explanation will be omitted. Thus, the present invention can be used as a control device in which not only the equipment which operates at a high frequency but also the temperature, etc. have a simple configuration of a physical amount whose state changes comparatively gradually. In this case, variable gain type amplifiers of a necessary number of stages may be arranged to adjust the control amount.

Figure 5:
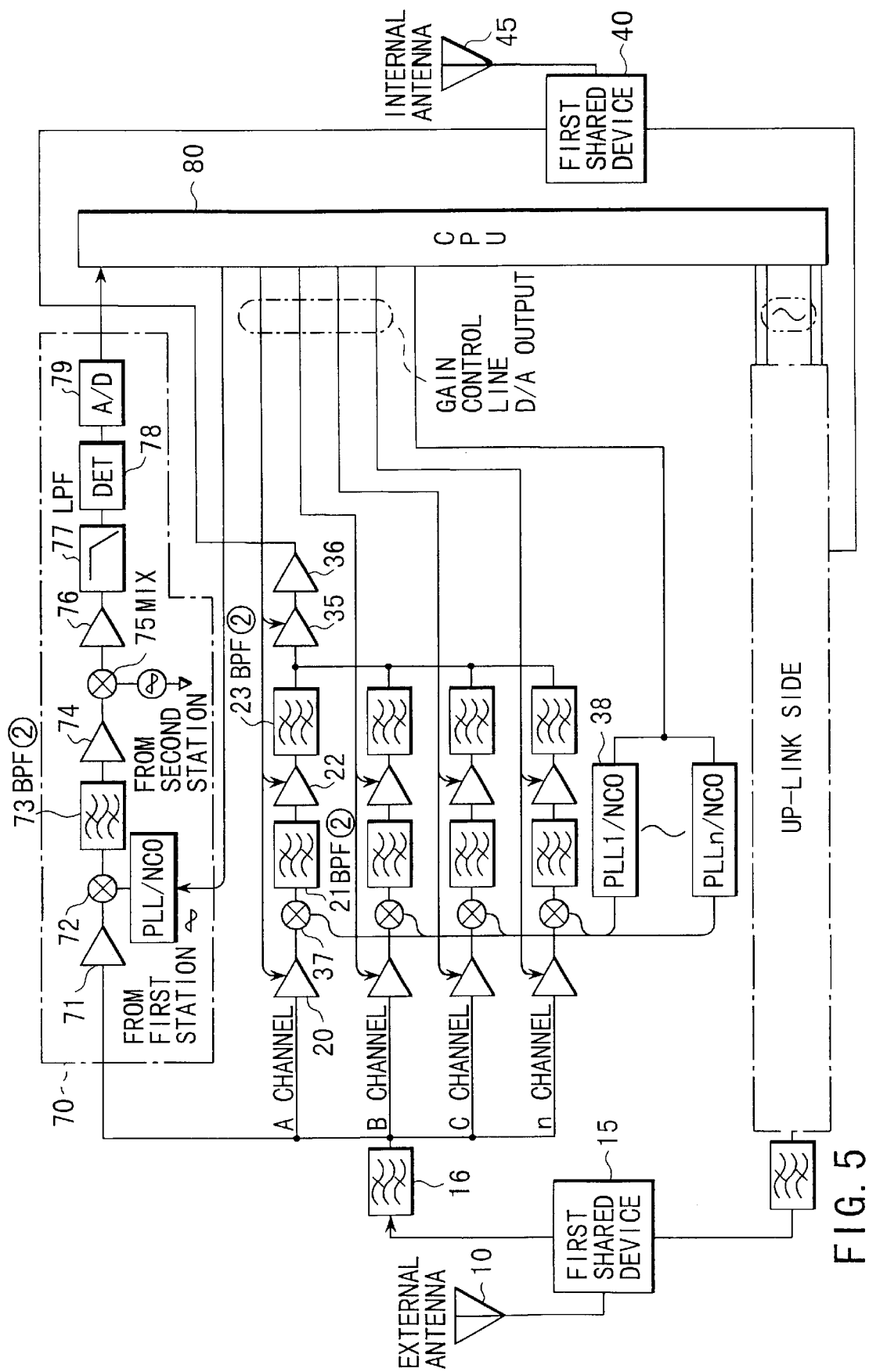
FIG. 5 is an outline figure of the control device according to the third embodiment of the present invention.

FIG. 5 is an outline figure of the control device according to the third embodiment of the present invention. In FIG. 5, since the configuration and operation of down-link and up-link is the same, only the configuration and the operation of down-link is shown and the explanation will be omitted about up-link.

In FIG. 5, the carrier which is received with external antenna 10 and passes band-pass filter 21 through first shared device 15 is input to scanning section 70 and the plurality of amplification systems in each channel. This channel means a channel of each time slot in a TDMA (time-division and multiple access method), and means the channel of each predetermined frequency in an FDMA (frequency division access method), and it may also be applied to other method, for example, CDMA (code division access method) etc. Hereinafter, it will be explained as TDMA.

The carrier input to scanning section 70 is amplified in the predetermined gain, is band-limited by first band-pass filter 16, and then amplified by third amplifier 71. Next, the carrier is mixed with the phase reference signal from CPU 80 described later in detail with mixer 72, band-limited with second band-pass filter 73, thereafter, amplified again with fourth amplifier 74, and DC-detected by detector 78 through low-pass filter 77. The DC-detected signal is analog-to-digital-converted with A/D converter 79 and input to CPU 80. CPU 80 outputs the feedback signal to amplifiers 20, 22, and 35 of each channel described later in detail based on the input signal from A/D converter 79.

Next, the configuration and the operation of each channel will be explained. The configuration and the operation of A channel will be explained since the configuration of each channel is the same.

A channel has two amplifiers and two band-pass filters 21. First, the carrier input to the channel is amplified with first amplifier 21. Here, first amplifier 21 is variable gain amplifier, and amplifies the input signal (carrier) by the gain corrected by the above-mentioned feedback signal. Then, the input signal is mixed with phase reference signal from CPU 80 and mixer 37 to take the phase synchronization, then band-limited with band-pass filter 21, and, in addition, amplified with second amplifier 22 as well as first amplifier 21. Then, the band-limited signal with band-pass filter 23 is amplified with fifth amplifier 35. The adjustment of the gain of this fifth amplifier 35 is performed as well as first amplifier 21. The signal that the gain of each channel from A channel to n channel is adjusted is input to the fifth amplifier 35. The signal (signal of TDMA or FDMA) from fifth amplifier 35 is output from internal antenna 45 to the portable terminal, for example, as a carrier through second shared device 40. Sixth amplifier 36 of the fixed-gain type may be provided in the latter part of fifth amplifier 35.

As described above, in the third embodiment, the result of phase-synchronization, and integration of the level in the predetermined time by scanning and conversion of the RMS (Root Mean Square) DC detection signal of the time with the A/D converter, is input, an optimal output of the amplifier is set by CPU 80, and the feedback signal is output. A synchronous detection of the carrier level is performed according to synchronous timing of TDMA, and an automatic gain amplification is performed by CPU 80. Therefore, according to the third embodiment, the level of each channel can be averaged in the TDMA method. It is possible to apply also to other division multiple access methods similarly.

The present invention is not limited to the above-mentioned embodiments, it is possible to execute by transforming them within the scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A control device comprising:
   an input section which inputs a predetermined signal;
   an amplification section of a variable gain type which amplifies said predetermined signal; and
   a feedback loop which inputs a signal output from said amplification section and adjusts a gain of said amplification section to keep said output signal constant;
   wherein said amplification section comprises an amplifier of a fixed-gain type and an attenuator in which an attenuation amount is changed according to a signal from said feedback loop; and
   wherein said attenuator has an attenuation element including a PIN diode, a first resistance element having a first end and a second end, said first end connected with a previous stage of said attenuation element and said second end connected with a first voltage, and a second resistance element having a third end and a fourth end, said third end connected with a previous stage of said attenuation element and said fourth end connected with a second voltage.

2. A control device comprising:
   an antenna which receives a carrier;
   a first amplification section of a variable gain type which amplifies said carrier;
   a band-pass filter to pass only a carrier in a predetermined band;
   a second amplification section of a variable gain type which amplifies a carrier which has passed said band-pass filter; and
   a feedback loop which inputs a carrier output from said second amplification section and adjusts a gain of said first and said second amplification sections to keep said output carrier constant.

3. A control device comprising:
   an antenna which receives a division multiplexed carrier;

a first band-pass filter to pass a desired band of said carrier;

a plurality of amplifiers provided in each channel which amplifies a carrier, which has passed said first band-pass filter, to a desired intensity for each channel;

a scanning section which phase-synchronizes the carrier which has passed said first band-pass filter, performs analog-to-digital conversion of a detected signal and output a converted signal; and a controller which sets an optimal output of said plurality of amplifiers based on the signal from said scanning section and adjusts gains of said plurality of amplifiers.

* * * * *